US012593392B2

(12) United States Patent
Bøe et al.

(10) Patent No.: US 12,593,392 B2
(45) Date of Patent: Mar. 31, 2026

(54) PRINTED CIRCUIT BOARD ASSEMBLY

(71) Applicant: Rolls-Royce Deutschland Ltd & Co KG, Blankenfelde-Mahlow (DE)

(72) Inventors: Maria Bøe, Trondheim (NO); Jan Magnus Farstad, Trondheim (NO)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 292 days.

(21) Appl. No.: 18/227,287

(22) Filed: Jul. 27, 2023

(65) Prior Publication Data

US 2024/0040686 A1 Feb. 1, 2024

(30) Foreign Application Priority Data

Jul. 28, 2022 (DE) ..................... 10 2022 118 926.0

(51) Int. Cl.
*H05K 1/00* (2006.01)
*H05K 1/02* (2006.01)
*H05K 1/183* (2026.01)

(52) U.S. Cl.
CPC ........... *H05K 1/0203* (2013.01); *H05K 1/183* (2013.01); *H05K 2201/09545* (2013.01)

(58) Field of Classification Search
CPC ................. H05K 1/0203; H05K 1/183; H05K 2201/09545
See application file for complete search history.

(56) References Cited

U.S. PATENT DOCUMENTS

| | | | |
|---|---|---|---|
| 2015/0050830 A1* | 2/2015 | Debabrata | .......... H01R 12/7088 |
| | | | 439/485 |
| 2020/0161519 A1* | 5/2020 | Deckers | ................. H01L 23/15 |
| 2024/0071863 A1* | 2/2024 | Siko | .................... H01L 23/4006 |
| 2024/0098940 A1* | 3/2024 | Chung | ................. H05K 9/0015 |

* cited by examiner

*Primary Examiner* — Pete T Lee
(74) *Attorney, Agent, or Firm* — Lempia Summerfield Katz LLC

(57) ABSTRACT

A printed circuit board assembly includes a printed circuit board and a power connector. The printed circuit board includes an upper surface, a lower surface, and plated through-holes. The power connector is arranged at the upper surface of the printed circuit board and includes a plurality of pins extending through the plated through-holes. The plurality of pins are configured to extend through the plated through-holes and protrude from the lower surface of the printed circuit board. A heat spreading block located at the lower surface is provided. Ends of the plurality of pins are arranged in the heat spreading block.

17 Claims, 2 Drawing Sheets

PRINTED CIRCUIT BOARD ASSEMBLY

This application claims the benefit of German Patent Application No. DE 10 2022 118 926.0, filed on Jul. 28, 2022, which is hereby incorporated by reference in its entirety.

BACKGROUND

The present embodiments relate to a printed circuit board assembly and a heat spreading block suitable for such printed circuit board assembly.

In power electronics, power connectors are used to provide for a high-current contact to a printed circuit board to which power semiconductors such as power MOSFETs or IGBT devices or other elements of power electronics are connected. A power connector typically includes a plurality of pins that are arranged in plated through-holes of the printed circuit board. The pins provide high-current to one or a number of the conductive layers of the printed circuit board.

One known example of such power connectors are Press-fit connectors of Würth Elektronik, where pins of a power connector are pressed into plated through-holes of the printed circuit board, thereby creating a tight electrical connection with a small contact resistance.

One problem associated with power connectors is heat generation caused by the high currents provided through the power connectors. Power connectors are difficult to cool as there is no even surface for a heat spreader or heat sink to connect to. Therefore, cooling by natural or forced convection or through a conductive layer of the printed circuit board are the only cooling mechanisms available.

SUMMARY AND DESCRIPTION

The scope of the present invention is defined solely by the appended claims and is not affected to any degree by the statements within this summary.

The problem underlying the present embodiments is to provide for a printed circuit board assembly that allows improved cooling of power connectors connected to the printed circuit board.

Accordingly, an aspect of the present embodiments regards a printed circuit board assembly. The printed circuit board assembly includes a printed circuit board. The printed circuit board has an upper surface, a lower surface, and plated through-holes. The printed circuit board assembly further includes a power connector. The power connector is arranged at the upper surface of the printed circuit board and includes a plurality of pins that extend through the plated through-holes.

It is provided that the plurality of pins are configured to extend through the plated through-holes and protrude from the lower surface of the printed circuit board. Further, a heat spreading block is provided at the lower surface. The ends of the plurality of pins are arranged in the heat spreading block.

The present embodiments are thus based on the idea of providing a heat spreading block at the lower surface of the printed circuit board that serves to cool the plurality of pins of the power connector. Such cooling is primarily through heat conduction. Direct cooling of the plurality of pins is enabled by the plurality of pins protruding from the lower surface such that the plurality of pins may come into contact with the heat spreading block.

In an embodiment, the heat spreading block has a flat top side. The flat top side is arranged at the lower surface of the printed circuit board and includes holes that are configured to receive the protruding power connector pins. For example, it may be provided that the holes in the heat spreading block are configured such that the power connector pins are pressed into the holes by a press-fit connection or a shrink-fit connection. By implementing a press-fit or shrink fit connection of the pins in the holes of the heat spreading block, a good thermal contact between the plurality of pins and the heat spreading block, and thus, a high cooling performance by the heat spreading block may be achieved.

In a further embodiment, the heat spreading block has a flat bottom side. The flat bottom side is configured to lie flatly against a heat sink, either directly or through a thermal interface material. This allows to cool the heat spreading block as well by thermally coupling the heat spreading block to a heat sink. The footprint and the bottom contact surface of the heat spreading block may be adjusted and optimized depending on the dimensions of the heatsink.

In a further embodiment, the heat spreading block consists of the same material as the power connector pins. However, this is not necessarily the case; in other embodiments, the heat spreading block consists of a different material than the power connector pins.

It is generally desired that the heat spreading block includes a high thermal conductivity, as the higher the conductivity of the heat spreading block, the better the cooling of the pins. In an embodiment, the heat spreading block includes a thermal conductivity larger than 30 $Wm^{-1}K^{-1}$ or larger than 300 $Wm^{-1}K^{-1}$.

The heat spreading block may be made out of metal or out of a metal alloy, such as copper, aluminum, copper alloys, and aluminum alloys.

The heat spreading block may consist of an electrically conductive material, such as metal. This does not pose any problem, as the different pins of the power connector are applied with the same voltage. However, at the same time, it is not a requirement that the heat spreading element is electrically conductive. In other embodiments, the heat spreading block is made out a non-conductive material such as a ceramic material or a plastic material.

In a further embodiment, the pins are configured to protrude from the lower surface of the printed circuit board with a length in the range between 0.8 to 3 mm or in the range between 1 and 1.5 mm. Accordingly, the pins may stick out with a small length only, which is already sufficient to provide for a cooling of the pins by the heat spreading block.

In a further embodiment, when the length that the pins protrude from the lower surface of the printed circuit board is d, the thickness of the heat spreading block lies in the range between 1.1*d and 3*d. Accordingly, it may be provided that the thickness of the heat spreading block is only slightly larger than the amount that the pins protrude from the lower surface.

In a further embodiment, the lower surface of the printed circuit board includes a metal layer such as a copper layer, where the heat spreading block also contacts the metal layer. The metal layer further increases the heat transfer between the heat spreading block, the through holes, and the pins.

As already discussed, in an embodiment, the pins of the power connector are pressed into the holes in the spreading block by a press-fit connection or a shrink-fit connection to improve the thermal contact between the pins and the heat spreading block. Further, within the printed circuit board, the pins may be arranged in the plated through-holes by a press-fit connection or a shrink-fit connection as well. Alternatively, the pins may be connected to the through-holes using through-hole technology (THT), where the pins are soldered to the through-holes.

The heat spreading block may be a monobloc (e.g., formed in one piece). The heat spreading block may take a plurality of forms depending on the geometry in which it is applied. In an embodiment, the heat spreading block is formed as a one-piece cuboid, having its flat top side and its flat bottom side arranged in parallel.

For the purposes of the present embodiments, the side of the printed circuit board on which the heat spreading block is located is always referred to as the lower surface of the printed circuit board, irrespective of whether the printed circuit board is arranged horizontally or not.

According to a further aspect of the present embodiments, a heat spreading block suitable for use with a printed circuit board assembly of the present embodiments is provided. The heat spreading block includes: a flat top side. The flat top side includes holes that are configured to receive the pins of a power connector protruding from a printed circuit board, and a flat bottom side.

The embodiments of the heat spreading block discussed with respect to claim 1 similarly apply to the heat spreading block of claim 15. For example, holes in the heat spreading block may be configured to receive the pins of a power connector in a press-fit or shrink-fit manner.

BRIEF DESCRIPTION OF THE DRAWINGS

The invention will be explained in more detail based on embodiments with reference to the accompanying drawings in which.

DETAILED DESCRIPTION

Figure 1:
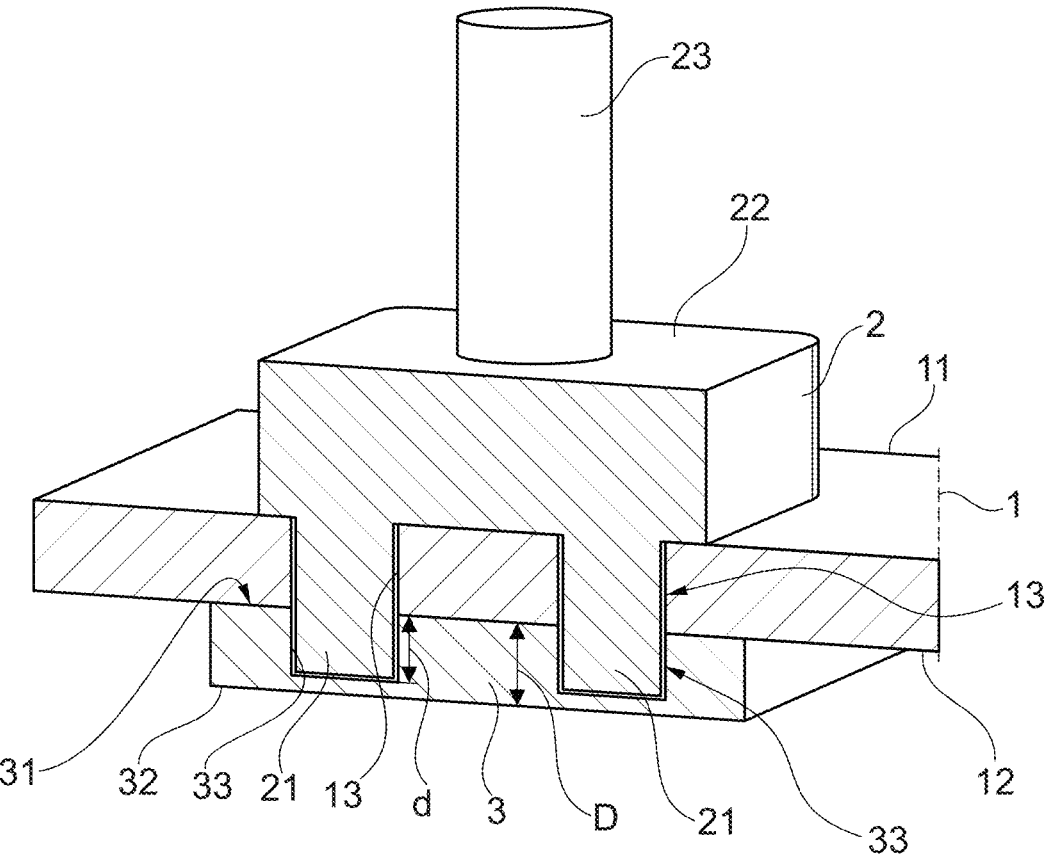
FIG. 1 is a sectional view of an embodiment of a printed circuit board assembly.
Figure 3:
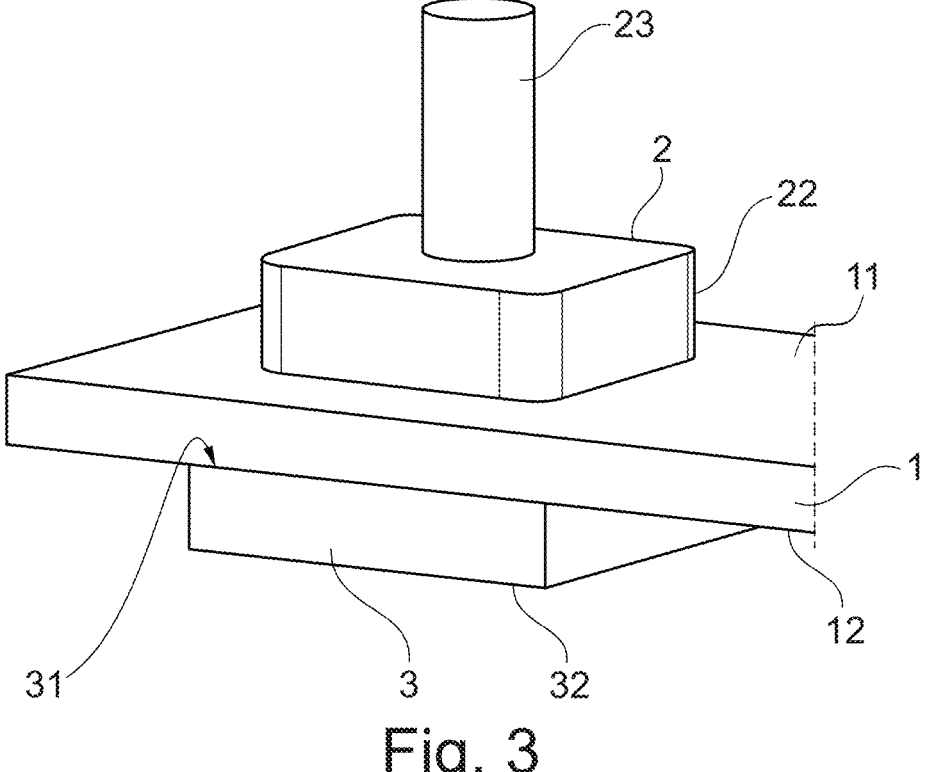
FIG. 3 is a perspective view of the printed circuit board assembly of FIG. 1.

FIGS. 1 and 3 illustrate, in a sectional view and in a perspective view, respectively, a first embodiment of a printed circuit board assembly.

The printed circuit board assembly includes, as main components, a printed circuit board 1, a power connector 2, and a heat spreading block 3.

The printed circuit board 1 includes an upper surface 11 and a lower surface 12. In the printed circuit board 1, a plurality of plated through-holes 13 that extend from the upper surface 11 to the lower surface 12 are provided. The plated through-holes 13 may be implemented in a conventional manner (e.g., holes are drilled vertically through the printed circuit board 1 and plated with a metal such as copper).

The printed circuit board 1 may be a single layer circuit board or a multi-layer circuit board. The printed circuit board 1 includes one or a number of layers of insulating material (e.g., FR4) and one or a number of conductive layers (not shown), with the individual layers being joined and structured by lamination and etching processes, as is known to the person skilled in the art.

The power connector 2 serves to apply a high voltage/high current to the circuit board 1, such as currents up to 500 A. The power connector 2 includes a main body 22 that may be cuboid and is arranged on the upper surface 11 of the printed circuit board 1. The power connector 2 includes a connecting element 23 that serves to connect to a cable connector or the like of a cable that provides the high voltage/high current. In other embodiments, the connecting element 23 may be a threaded hole or other attachment for a cable connector.

The power connector 2 further includes a plurality of pins 21 that extend from the main body 22. The plurality of pins 21 extend through the plated through-holes 13 of the printed circuit board 1. The plurality of pins 21 serve to provide one or a number of layers of the printed circuit board 1 with the high voltage/high current provided through the connecting element 23. The plurality of pins 21 may be arranged in a particular geometrical pattern, such as in a rectangular grid. The power connector 2 with the main body 22, the pins 21, and the connecting element 23 may be formed in one piece.

The plurality of pins 21 have a length that is longer than the depth of the plated through-holes 13. Accordingly, the plurality of pins 21 protrude from the lower surface 12 of the printed circuit board 1. More particularly, the plurality of pins 21 protrude with a length d from the lower surface 12. The length d may lie in the range between 0.8 mm and 3 mm or in the range between 1 mm and 1.5 mm.

The heat spreading block 3 includes a flat top side 31 and a flat bottom side 32. The flat top side 31 lies against the lower surface 12 of the printed circuit board 1. The top side 31 includes a plurality of holes 33 that extend rectangularly from the top side 31 and are configured to receive the plurality of pins 21 of the power connector 2 that protrude from the lower surface 12. The heat spreading block 3 has a thickness D that is larger than the length d with which the plurality of pins 21 protrude from the lower surface 12. In embodiments, the thickness D of the heat spreading block lies in the range of $1.1*d$ and $3*d$.

The flat bottom side 32 of the heat spreading block 3 is configured to lie flatly against a heat sink (not shown), either directly or through a thermal interface material (e.g., that may be electrically conductive or non-conductive). The heat spreading block 3 may be a cuboid.

In the embodiment of FIGS. 1 and 3, the holes 33 of the heat spreading block 3 have a diameter such that the power connector pins 21 are held in the holes 33 by a press-fit connection or a shrink-fit connection. In a press-fit connection, the plurality of pins 21 are pressed into the holes 33. In a shrink-fit connection, an interference fit is achieved between the plurality of pins 21 and the holes 33 by a relative size change after assembly. The relative size change is caused by heating or cooling one of the components before assembly. Alternatively, it may be provided that the plurality of pins 21 have a size smaller than the size of the holes 33 in the heat spreading block 3; in this case, the plurality of pins 21 may be soldered to the holes 33.

Within the plated through-holes 13 of the printed circuit board 1, the plurality of pins 21 may also be held by a press-fit connection, a shrink-fit connection, or a THT connection.

The plurality of pins 21 may have a circular or polygonal (e.g., square) cross-section.

The spreading block 3 may consist of the same material as the power connector 2 and the plurality of pins 21. In embodiments, the heat spreading block 3 consists of copper, aluminum, a copper alloy, or aluminum alloy. Accordingly, the heat spreading block 3 may be electrically conductive. This is unproblematic as the plurality of pins 21 of the power connector 2 are at the same electrical potential anyway.

Figure 2:
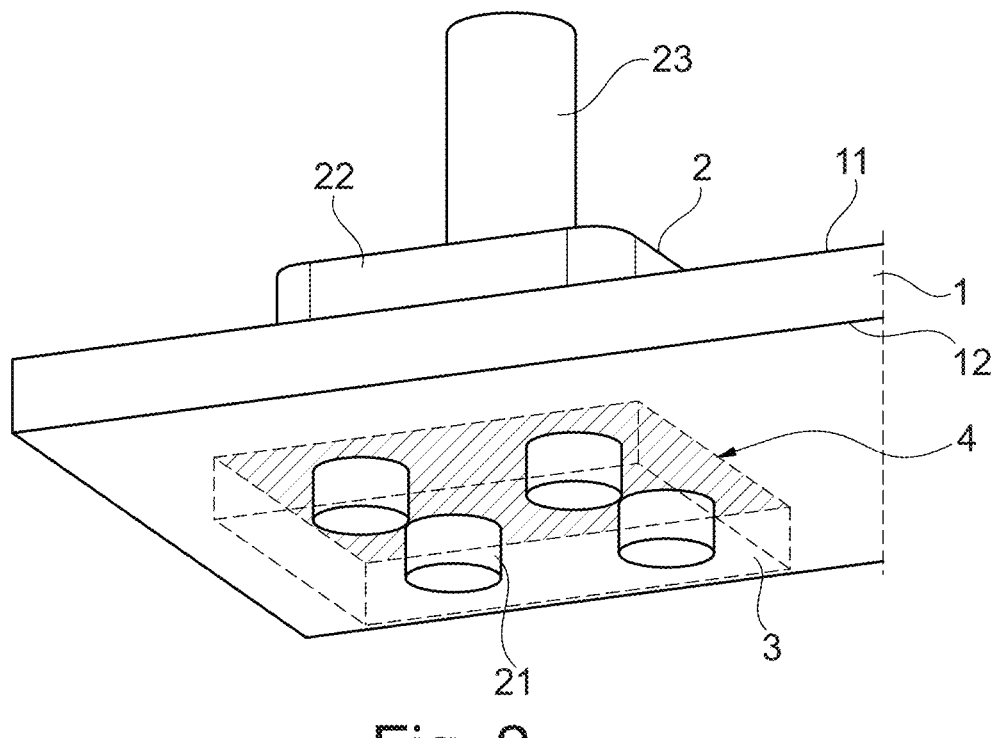
FIG. 2 is an embodiment of a printed circuit board assembly in accordance with FIG. 1.

FIG. 2 shows an embodiment that is mostly the same to the embodiment of FIG. 1, such that reference is made to the description of the embodiment of FIG. 1. The embodiment of FIG. 2 differs from the embodiment of FIG. 1 in that a metal layer 4 is arranged at the lower surface 12 of the printed circuit board 1 in the area around the plurality of pins 21. The metal layer 4 may be a copper layer or an aluminum layer. The flat top side 31 of the heat spreading block 3, accordingly, lies against the metal layer 4. Alternatively, there may be a thermal interface material between the heat spreading block 3 and the metal layer 4 of the printed circuit board 1. The flat top side 31 of the heat spreading block 3 lies against the metal layer 4 with the thermal interface material in between.

By providing a metal layer 4, the thermal contact between the heat spreading block 3 and the plated through-holes 13 of the printed circuit board 1 as well as between the heat spreading block 3 and the plurality of pins 21 (e.g., which are in thermal contact with the metal layer 4 through the through-holes) is improved, such that heat transfer towards the heat spreading block 3 is further increased.

The above description is intended for illustrative purposes only and is not intended to limit the scope of the present disclosure in any way. Also, those skilled in the art will appreciate that other aspects of the disclosure may be obtained from a study of the drawings, the disclosure, and the appended claims. All methods described herein may be performed in any suitable order unless otherwise indicated herein or otherwise clearly contradicted by context. Various features of the various embodiments disclosed herein may be combined in different combinations to create new embodiments within the scope of the present disclosure. In particular, the disclosure extends to and includes all combinations and sub-combinations of one or more features described herein. Any ranges given herein include any and all specific values within the range and any and all subranges within the given range.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A printed circuit board assembly comprising:
   a printed circuit board comprising an upper surface, a lower surface, and plated through-holes;
   a power connector that is arranged at the upper surface of the printed circuit board, the power connector comprising a plurality of pins extending through the plated through-holes, wherein the plurality of pins are configured to extend through the plated through-holes and protrude from the lower surface of the printed circuit board; and a heat spreading block provided at the lower surface of the printed circuit board, wherein ends of the plurality of pins are arranged in the heat spreading block.

2. The printed circuit board assembly of claim 1, wherein the heat spreading block has a flat top side, the flat top side being arranged at the lower surface of the printed circuit board and comprising holes that are configured to receive the plurality of pins of the power connector.

3. The printed circuit board assembly of claim 2, wherein the holes in the heat spreading block are configured such that the plurality of pins of the power connector are held in the holes by a press-fit connection or a shrink-fit connection.

4. The printed circuit board assembly of claim 1, wherein the heat spreading block has a flat bottom side, the flat bottom side being configured to lie flatly against a heat sink.

5. The printed circuit board assembly of claim 1, wherein the heat spreading block consists of a same material as the plurality of pins of the power connector.

6. The printed circuit board assembly of claim 1, wherein the heat spreading block has a thermal conductivity larger than 30 $Wm^{-1}K^{-1}$.

7. The printed circuit board assembly of claim 6, wherein the heat spreading block has a thermal conductivity larger than 300 $Wm^{-1}K^{-1}$.

8. The printed circuit board assembly of claim 1, wherein the heat spreading block is made out of metal or a metal alloy.

9. The printed circuit board assembly of claim 1, wherein the heat spreading block is electrically conductive.

10. The printed circuit board assembly of claim 1, wherein the heat spreading block is made out a ceramic material or a plastic material.

11. The printed circuit board assembly of claim 1, wherein the plurality of pins are configured to protrude from the lower surface of the printed circuit board with a length in a range between 0.8 and 3 mm.

12. The printed circuit board assembly of claim 11, wherein the plurality of pins are configured to protrude from the lower surface of the printed circuit board with the length in a range between 1 and 1.5 mm.

13. The printed circuit board assembly of claim 11, wherein when the length that the plurality of pins protrude from the lower surface of the printed circuit board is d, a thickness of the heat spreading block lies within a range between 1.1*d and 3*d.

14. The printed circuit board assembly of claim 1, wherein the lower surface of the printed circuit board comprises a metal layer, and
   wherein the heat spreading block contacts the metal layer.

15. The printed circuit board assembly of claim 1, wherein the plurality of pins are arranged in the through-holes of the printed circuit board by a press-fit connection or a shrink-fit connection.

16. The printed circuit board assembly of claim 1, wherein the heat spreading block is formed as a one-piece cuboid.

17. A heat spreading block comprising:
   a body including:
      a flat top side comprising holes that extend partially through the body of the heat spreading block, the flat top side of the body being positionable on a printed circuit board, such that the holes are configured to receive pins of a power connector extending through and protruding from the printed circuit board; and
      a flat bottom side.

* * * * *